(12) United States Patent
Laursen

(10) Patent No.: US 10,608,676 B2
(45) Date of Patent: Mar. 31, 2020

(54) BIT-ALIGNMENT TESTING FOR OBTAINING FEC CODE LOCK

(71) Applicant: INTEL CORPORATION, Santa Clara, CA (US)

(72) Inventor: Soren Laursen, Denmark (DK)

(73) Assignee: Intel Corporation, Santa Clara, CA (US)

( * ) Notice: Subject to any disclaimer, the term of this patent is extended or adjusted under 35 U.S.C. 154(b) by 130 days.

(21) Appl. No.: 15/634,312

(22) Filed: Jun. 27, 2017

(65) Prior Publication Data

US 2018/0375534 A1   Dec. 27, 2018

(51) Int. Cl.
| | |
|---|---|
| *H03M 13/39* | (2006.01) |
| *H03M 13/37* | (2006.01) |
| *H03M 13/33* | (2006.01) |
| *H03M 13/27* | (2006.01) |
| *H03M 13/15* | (2006.01) |

(52) U.S. Cl.
CPC ..... *H03M 13/3944* (2013.01); *H03M 13/333* (2013.01); *H03M 13/3723* (2013.01); *H03M 13/1515* (2013.01)

(58) Field of Classification Search
CPC ......... H03M 13/3944; H03M 13/3723; H03M 13/3977; H03M 13/451; H03M 13/49; H03M 13/333; H03M 13/1515
See application file for complete search history.

(56) References Cited

U.S. PATENT DOCUMENTS

| | | | | |
|---|---|---|---|---|
| 6,691,278 B1 * | 2/2004 | Patapoutian | ....... | G11B 20/1833 714/785 |
| 7,298,798 B1 * | 11/2007 | Chao | ................ | H04L 25/03203 341/143 |
| 7,426,678 B1 * | 9/2008 | Cory | ..................... | H03M 13/19 714/774 |
| 9,172,505 B1 | 10/2015 | Yang et al. | | |

(Continued)

OTHER PUBLICATIONS

IEEE 100, The Authoritative Dictionary of IEEE Standards Terms, Seventh Edition, IEEE Standards Information Network, IEEE Press (Year: 2000).*

(Continued)

*Primary Examiner* — April Y Blair
*Assistant Examiner* — Dipakkumar B Gandhi

(57) ABSTRACT

Methods and apparatus disclosed herein may be used to establish framing more efficiently in communication protocols with block-coded forward error correction. Such protocols generally involve the check of different bit-alignments searching for positions that yield zero syndromes. The search can be undesirably slow, particularly in the presence of received errors. The presently-disclosed bit-alignment testing technique reduces this search time by checking the syndrome at each data word as if that data word was the last of a code. In other words, the word positions are effectively checked without a prior assumption as to which words are the first and last of the code. This reduces the task to the number of different bit-alignments possible within a single data word, rather than the number of bit-alignments possible in a complete FEC code. In one implementation, the lock time is reduced by approximately 50 times when compared to a straightforward solution.

20 Claims, 6 Drawing Sheets

```
1-1)Init at start of RS code:
1-2)  Clear synd_work 1-3)for each data word in the received RS code do
1-4)  contrib = contribution from the w symbols in the data word
1-5)  synd_shift = synd_work shifted w positions, the width of the data word
1-6)  synd_work = synd_shift xor contrib
1-7)endloop
1-8)syndrome = synd_work shifted by 2ᵐ-1 - n positions, i.e. pad up to full-length if code
         is shortened (some implementations omit this padding and adjust the subsequent
         Chien search instead)
```

(56) References Cited

U.S. PATENT DOCUMENTS

| | | | | |
|---|---|---|---|---|
| 2002/0166090 A1* | 11/2002 | Maeda | .................... | G11B 20/18 |
| | | | | 714/746 |
| 2004/0155802 A1* | 8/2004 | Lamy | ...................... | H03M 7/40 |
| | | | | 341/67 |
| 2005/0166126 A1* | 7/2005 | Muller | .............. | H03M 13/1515 |
| | | | | 714/784 |
| 2006/0212784 A1* | 9/2006 | Griniasty | .............. | H03M 13/35 |
| | | | | 714/791 |
| 2008/0109705 A1* | 5/2008 | Pawlowski | ......... | G06F 11/1044 |
| | | | | 714/767 |
| 2013/0173991 A1* | 7/2013 | Ware | .................... | G11C 7/1006 |
| | | | | 714/763 |

OTHER PUBLICATIONS

Hsu et al., "A soft decision syndrome decoding algorithm for convolutional codes", 1990, IEEE Conference on Military Communications, pp. 375-379 (Year: 1990).*

* cited by examiner

```
1-1) Init at start of RS code:
1-2)   Clear synd_work 1-3) for each data word in the received RS code do
1-4)   contrib = contribution from the w symbols in the data word
1-5)   synd_shift = synd_work shifted w positions, the width of the data word
1-6)   synd_work = synd_shift xor contrib
1-7) endloop
1-8) syndrome = synd_work shifted by $2^m-1 - n$ positions, i.e. pad up to full-length if code
        is shortened (some implementations omit this padding and adjust the subsequent
        Chien search instead)
```

```
2-1)   Test bit-alignment:
2-2)   j = 0
2-3)   synd_work = 0 (not really needed as any initial value for synd_work will work)
2-4)   for each received data word do
2-5)     contrib = contribution from the w symbols in the data word
2-6)     synd_shift = synd_work shifted w positions, the width of the data word
2-7)     synd_work = synd_shift xor contrib
2-8)     mem[j] = synd_work
2-9)     syndrome = synd_work shifted by $2^m-1 - n$ positions, i.e. pad up to full-length
2-10)    if j >= n/w, then mem content now valid for this bit-alignment
2-11)      if (syndrome xor mem[j - n/w]) = 0 then
2-12)        found a match, exit loop and further check this bit-alignment
2-13)    if j >= 2*n/w then all the n/w word-alignments at this bit-alignment checked
2-14)      no match here, exit loop, apply a bit-slip and test a new bit-alignment
2-15)    j = j + 1
2-16)  endloop
```

```
3-1)   Test bit-alignment:
3-2)   j = 0
3-3)   synd_work = 0 (not really needed as any initial value for synd_work will work)
3-4)   for each received data word do
3-5)       contrib = contribution from the w symbols in the data word
3-6)       synd_shift = synd_work shifted w positions, the width of the data word
3-7)       synd_work = synd_shift xor contrib
3-8)       mem[j] = synd_work
3-9)       tmp = synd_work shifted by $2^m-1 - n$ positions, i.e. pad up to full-length
3-10)      syndrome = tmp xor scrambling_syndrome
3-11)      if j >= n/w, then mem content now valid for this bit-alignment
3-12)          if (syndrome xor mem[j - n/w]) = 0 then
3-13)              found a match, exit loop and further check this bit-alignment
3-14)      if j >= 2*n/w then all the n/w word-alignments at this bit-alignment checked
3-15)          no match here, exit loop, apply a bit-slip and test a new bit-alignment
3-16)      j = j + 1
3-17)  endloop
```

BIT-ALIGNMENT TESTING FOR OBTAINING FEC CODE LOCK

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Technical Field

The present invention relates generally to data communication.

Description of the Background Art

Serial communication protocols generally include means to establish framing. In other words, these protocols include means to group bits into larger entities called frames.

To establish framing, certain protocols (such as Ethernet and Fibre Channel™, for example) employ bit patterns that are recognizable by the receiver. These bit patterns are recognizable either because they do not occur elsewhere, or because other parts of the bit stream are scrambled such that only the framing patterns occur periodically.

Communication protocols that employ block-coded forward error correction (FEC) may use the inherent redundancy in the code to establish framing; only when the receiver is aligned to the FEC codes will error-free codes be detected. This technique requires that the input bit error rate be sufficiently low such that FEC codes without any error are received frequently. For example, 32 Gb/s Fibre Channel (32 GFC) uses this mechanism to establish framing.

With 32 GFC, for example, a Reed-Solomon code is used, where the length of each FEC code is 5280 bits. To lock onto the data, the receiver can probe each of the possible 5280 alignments. Each alignment may be checked by calculating the syndrome. An all-zero syndrome indicates that an error-free FEC code has been found at that alignment. Alignment may be declared when the following block tested at that alignment is correctable by the FEC decoder.

A straightforward implementation of such a bit pattern search requires trying sequentially the possible starting positions. Even in the absence of errors this could require testing of all 5280 positions. For each starting position, the syndrome is computed, which requires the reception of 5280 bits. Hence, the reception of more than 5280*5280 bits is needed for a complete search of all starting positions. In addition, there is overhead in changing the bit alignment. Furthermore, a received bit error can cause a miss, such that another complete search would be needed. Such a search process may easily take 2 milliseconds or more, which is undesirably slow.

BRIEF DESCRIPTION OF THE DRAWINGS

FIG. 1 shows pseudocode that describes a procedure to evaluate a syndrome.

FIG. 2 shows pseudocode that describes an exemplary procedure for testing a bit alignment during a process to obtain code lock (when FEC codes are unscrambled) in accordance with an embodiment of the invention.

FIG. 3 shows pseudocode that describes an exemplary procedure for testing a bit alignment during a process to obtain code lock (when FEC codes are scrambled) in accordance with an embodiment of the invention.

DETAILED DESCRIPTION

Figure 4:
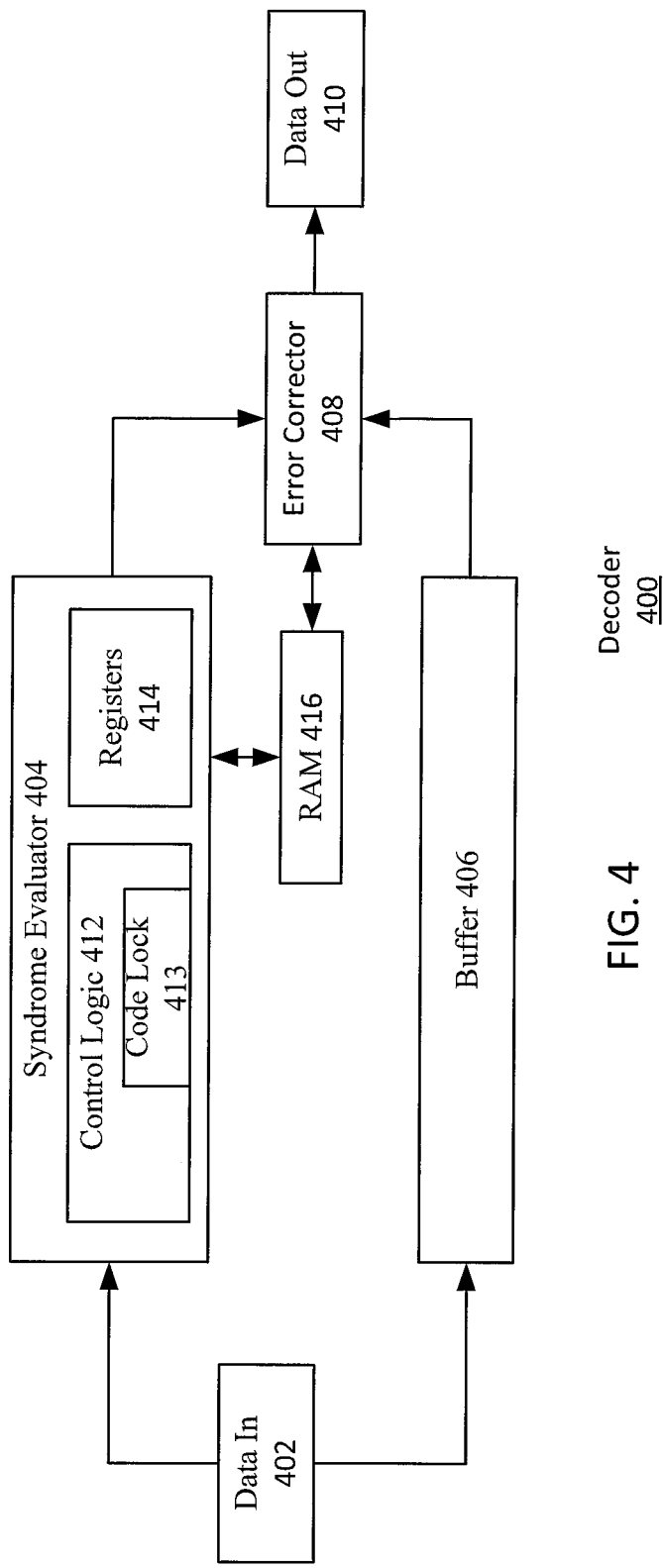
FIG. 4 is a high-level diagram showing an exemplary circuit structure for relevant circuitry within a decoder in accordance with an embodiment of the invention.

The present disclosure provides innovative methods and apparatus that may be used to efficiently establish framing in communication protocols. The methods and apparatus may be applied to communication protocols with block-coded forward error correction that use the inherent redundancy in the code to establish framing; only when the receiver is aligned to the FEC codes can error-free FEC codes be detected.

As discussed above in the Background section, the bit pattern search to obtain the code lock to establish framing generally requires a substantial amount of received data and so can be undesirably slow, particularly in the presence of errors. The present disclosure provides methods and apparatus to reduce this search time without adding a large amount of logic circuitry.

The presently-disclosed bit-alignment testing technique reduces this search time by checking the syndrome at each data word received as if that data word was the last of a FEC code. In other words, the data words are effectively checked without a prior assumption as to which words are the first and last of the FEC code. Let n be the number of FEC symbols per FEC code, let w be the number of FEC symbols processed in parallel, i.e. the number of FEC symbols per data word and let m be the number of bits per FEC symbol. Then the method of the invention reduces the number of different bit-alignments needing probing by at least a factor of n/w/2. This is because a full search involves probing only the w times m possible alignments within a data word. For example, under 32 G Fibre Channel, then n=528, m=10 and w may be 8, for instance. In this case, the time for a complete search may be reduced by a factor of at least 528/8/2=33. In the presence of errors, the time to lock is likely to be reduced even more on average.

The present disclosure provides a technique that enables syndromes to be evaluated more efficiently for purposes of obtaining a code lock to establish framing. Without requiring the addition substantial additional logic, the more efficient syndrome evaluation results in a reduced search time to obtain the code lock. In an exemplary implementation, the lock time is reduced by a factor of approximately 50 when compared to a straightforward solution.

To understand the presently-disclosed technique, it is beneficial to first review how the syndrome for a Reed-Solomon code is typically calculated. With a finite field, referred to as a Galois field, GF(2 m) and a primitive element a in that field, let G be the generating polynomial for a Reed-Solomon RS (n, k) code. The number of symbols transmitted in a frame is n=k+2t, where the amount of data in the frame is k symbols, and there are 2t additional symbol for error correction. Symbols are m bits wide, and the code is capable of correcting up to t=(n−k)/2 symbols.

The generating polynomial G, expressed below in Equation (1), has the 2t roots $\alpha^{b0}, \alpha^{b0+1}, \ldots, \alpha^{b0+2t-1}$, where b0 is usually chosen to be 0 or 1.

$$G(z) = \Pi_{i=0}^{2t-1}(z - \alpha^{b0+i}) \qquad \text{Equation (1)}$$

The symbols of a received code $d_{n-1}, d_{n-2}, \ldots, d_0$ are the coefficients of a polynomial R, which is expressed below in Equation (2).

$$R(z) = d_{n-1}z^{n-1} + d_{n-2}z^{n-2} + \ldots + d_0 \qquad \text{Equation (2)}$$

The 2t syndrome coefficients are the values of R evaluated at the points $\alpha^{b0}, \alpha^{b0+1}, \ldots, \alpha^{b0+2t-1}$. In other words, the syndromes are $s_i = R(\alpha^{b0+i})$, i=0, ..., 2t−1.

The following discussion assumes that each data word consists of an integer number of FEC symbols and that the RS(n,k) code contains an integer number of data words. As the RS code has n symbols, and the data word is w symbols wide, w must be chosen such that w divides n.

When using Homer's method with w symbols per iteration, the evaluation of the syndrome, i.e. the evaluation of R( ) at the specified points, can be performed using the procedure 100 shown by the pseudocode in FIG. 1. Lines 1-1 and 1-2 of the pseudocode indicates that, initially, at the start of the Reed-Solomon code, the register synd_work, is cleared (set to all zeroes). The register synd_work should be wide enough to hold the 2t syndrome coefficients, i.e. 2*t*m bits.

A procedural loop begins at line 1-3. For each data word in the received RS code, the procedural loop performs the steps of lines 1-4 to 1-6.

Per line 1-4, a contribution to the syndrome due to the w symbols in the data word is computed and stored in the register contrib, which should have a width equal to the 2t syndrome coefficients. I.e. 2t times m bits. The register contrib thus holds the contribution to the syndrome that corresponds to the data word that was just received.

Per line 1-5, the register synd_shift, which should also be 2t times m bits wide, is set to be the existing value in synd_work shifted by w symbol positions, the number of symbols per data word. In this context 'shifting by p positions' means that each of the syndrome coefficients $s_i$ is multiplied with the constant $\alpha^{p(b0+i)}$ in the finite field.

Per line 1-6, synd_work is set to be a new value that is the result of applying an exclusive-or (xor) operation to the values in synd_shift and contrib. This step combines the contributions from the previously received data words with the contribution from the most recently received data word.

Line 1-7 indicates the end of the above-described loop. The loop terminates after the last data word in the FEC code.

Following the loop, per line 1-8, the register syndrome may be set to be the value in synd_work shifted by $2^m-1-n$ positions, where n is the number of symbols in the RS code, and the symbols are m bits wide. If the code is shortened then this step modifies the value of synd_work as if zeroes were received up to the maximum FEC code length of $2^m-1$ symbols. Note that some implementations may omit this padding and adjust the subsequent Chien search instead.

While the procedure 100 disclosed above computes a syndrome, it requires that an assumption is made about which data word is the first in a FEC code. I.e. probing one alignment requires the reception of data block equal in size to a complete FEC code. The present disclosure provides a more efficient technique that may be performed faster without needing significant additional circuit logic. One embodiment of the disclosed technique is shown by the procedure 200 in the pseudocode of FIG. 2.

A decoder receives a bit stream that contains data words. In order to obtain code lock, the decoder needs to determine a bit-alignment so as to know which bits represent the start of an FEC code. The procedure 200 tests a bit-alignment during a process to obtain frame lock (i.e. code lock). The procedure 200 works on unscrambled FEC code (i.e. when the FEC code is not scrambled prior to transmission).

As indicated in line 2-1, the procedure 200 tests a bit-alignment. In particular, the procedure 200 tests n/w possible word alignments for a given bit-alignment to find a match (i.e. to find a syndrome that is all zeroes).

Lines 2-2 and 2-3 are initial steps. In line 2-2, a count j is set to zero. Per line 2-3, the register synd_work may be set to zero. The register synd_work is as wide as the syndrome, i.e. 2t times m bits. Note that this step of setting synd_work to zero is not really needed as the procedure 200 will work with any initial value for synd_work.

A procedural loop begins at line 2-4. For each data word received, the procedural loop performs the steps of lines 2-5 to 2-15. Each data word is w symbols wide.

Per line 2-5, a contribution to the syndrome due to the w symbols in the data word is computed and stored in the register contrib of width 2t times m bits.

Per line 2-6, the register synd_shift, is set to be the existing value in synd_work shifted by w symbol positions, the number of symbols per data word. The existing value synd_work is from previous iterations of the loop (i.e. from previous values of j) and holds a series of symbols that includes the syndrome contributions from previously received data words.

Per line 2-7, synd_work is set to be a new value that is the result of applying an exclusive-or (xor) operation to the values in synd_shift and contrib. This step combines the contributions from the previously received data words with the contribution from the most recently received data word.

In line 2-8, the value of synd_work is stored at a memory location j in a memory array, where the memory location j in the memory array is denoted by mem[j].

Per line 2-9, the register syndrome may be set to be the value in synd_work shifted by $2^m-1-n$ positions, where n is the number of symbols in the RS code, and the symbols are m bits wide. If the code is shortened, then this step modifies the value of synd_work as if zeroes were received up to the maximum FEC code length of $2^m-1$ symbols.

Line 2-10 is a conditional step. If the count j is greater than or equal to n/w, then the memory array content is now valid for this bit-alignment. In other words, the value that synd_work had n/w words earlier is present in mem[j-n/w]. Hence, if the condition in line 2-10 is satisfied, then the steps in lines 2-11 and 2-12 are performed. (On the other hand, if the condition in line 2-10 is not satisfied, then the procedure 200 skips forward to lines 2-13 and 2-14.)

Per lines 2-11 and 2-12, an exclusive-or (xor) operation is performed on the contents of syndrome and mem[j-n/w]. Note that mem[j-n/w] holds the value of synd_work from n/w words earlier. If the result of the xor operation is all zeroes, then a match has been found. I.e. a data block having the size of a FEC code resulted in an all-zero syndrome. In this case, since a compliant bit-alignment has been found, the procedure 200 may exit this loop and go on to perform further steps to check this bit-alignment so as to obtain frame lock. These further steps may include, given this bit-alignment, checking that the next data block with this alignment can be successfully decoded as a FEC code. If a match is not found, then the procedure 200 moves on to lines 2-13 and 2-14.

A further conditional step is expressed in lines 2-13 and 2-14. If the count j is greater than or equal to 2n/w, then all the n/w word-alignments at this bit-alignment have been checked, and no match has been found for this bit-alignment. In this case, the procedure 200 may exit this loop. Thereafter, a bit-slip may be applied to change the bit-alignment by e.g. one bit. The new bit-alignment may then be tested by again using the procedure 200.

Line 2-15 increments j by one for the next iteration of the loop. Finally, line 2-16 indicates the end of the loop.

Another embodiment of the disclosed technique is shown by the procedure 300 in the pseudocode of FIG. 3. Like the procedure 200 of FIG. 2, the procedure 300 of FIG. 3 tests a bit-alignment during a process to obtain code lock (i.e. frame lock). However, the procedure 300 of FIG. 3 works when each FEC code prior to transmission is scrambled using a fixed pattern. This is the case with e.g. 32 GFC.

The first eight lines (lines 3-1 to 3-8) of the procedure 300 of FIG. 3 is the same as (or similar to) the first eight lines (lines 2-1 to 2-8) of the procedure 200 of FIG. 2. In addition, the last seven lines (lines 3-11 to 3-17) of the procedure 300 of FIG. 3 is the same as (or similar to) the last seven lines (lines 2-10 to 2-16) of the procedure 200 of FIG. 2. (Of course, when a new bit-alignment is tested per line 3-15, the procedure 300, instead of the procedure 200, would be used, since the data is scrambled.)

However, lines 3-9 and 3-10 of the procedure 300 of FIG. 3 differ from line 2-9 of the procedure 200 of FIG. 2. Recall from the above description that line 2-9 of the procedure 200 of FIG. 2 sets the register syndrome to be the value in synd_work shifted by $2^m-1-n$ positions, where n is the number of symbols in the RS code, and the symbols are m bits wide. This step transfers the syndrome values from synd_work to syndrome as if zeroed data had been received up to the maximum of $2^m-1$ symbols.

Instead, line 3-9 of the procedure 300 of FIG. 3 sets the register tmp to be the value in synd_work shifted by $2^m-1-n$ positions, where n is the number of symbols in the RS code, and the symbols are m bits wide. This step transfers the syndrome values from synd_work to tmp modified as if zeroed symbols up to the maximum $2^m-1$ symbols had been received.

Subsequently, line 3-10 of the procedure 300 of FIG. 3 sets the register syndrome to be the result of an exclusive-or (xor) operation applied to the bits in the tmp register and the bits in the scrambling_syndrome register. The scrambling_syndrome register holds the constant resulting when calculating the syndrome over the scrambling pattern itself (padded with zeroes up to $2^m-1$ symbols). The impacts of the scrambling upon the syndrome can be cancelled out in this way because Reed-Solomon codes are linear codes. This obviates the need to descramble the data prior to the syndrome calculations.

In the above-described procedures 200 and 300, following a received FEC code candidate, the effect on the syndrome of the initial, in general non-zero, value of the synd_work register is canceled out by using the value that the synd_work register had n/w data words earlier (as stored at mem[j-n/w]). This cancellation is performed in line 2-11 of the procedure 200 in FIG. 2 and line 3-12 of the procedure 300 in FIG. 3. In other words, since synd_work is not cleared in these procedures 200 and 300 (as it is in the procedure 100), the result after a data word would not be the syndrome over the past n/w data words. To compensate for not having cleared synd_work in the past, the value of synd_work actually had n/w data words earlier is recalled, and the effect of the non-zero bits in that value is cancelled out.

Padding by up to $2^m-1$ symbols ensures that a simple xor operation suffices to cancel out the effect of the initial—in general non-zero—value of the register synd_work. This is because Reed-Solomon codes are cyclic. The padding can be omitted, but then an equivalent shift must be carried out before using the value passed through the memory array.

FIG. 4 is a high-level diagram showing an exemplary circuit structure for relevant circuitry within a decoder in accordance with an embodiment of the invention. As depicted, the Decoder 400 includes, among other components, Data In 402, Syndrome Evaluator 404, Data Buffer 406, Error Corrector 408, and Data Out 410. The Decoder 400 may be a decoder for a communication protocol that employs block-coded FEC and uses a single lane.

The data stream is received at the Data In 402. The received data stream is provided to the Syndrome Evaluator 404 and to the Data Buffer 406, which may be a first-in first-out (FIFO) buffer.

The procedure (200 or 300) described above in relation to FIG. 2 or FIG. 3 for testing a bit alignment during a process to obtain code lock (frame lock) may be implemented by a code lock module 413 in the control logic 412 within the Syndrome Evaluator 404. The procedure (200 or 300) may utilize Registers 414 to store various values. These values may include, if applicable, synd_work, contrib, synd_shift, syndrome, tmp, and scrambling_syndrome.

Note that the procedures for testing a bit alignment described above in relation to FIGS. 2 and 3 (200 and 300) appear to require an extra RAM to store the memory array (mem[ ] in the pseudocode) that holds the synd_work values. However, an exemplary implementation may avoid the need for such an extra RAM. This is because, during normal operation, the Error Corrector 408 of the Decoder 400 may buffer data in RAM 416 while calculating the corrections to apply. However, during operation to obtain the code lock, however, this same RAM 416 may be instead used to hold the memory array that stores the synd_work values or part thereof which are used by the Syndrome Evaluator 404.

Note also that storing all the 2t coefficents of synd_work is not generally needed. For example, with several (such as four or more) of the coefficients stored, a comparison using that subset may be adequate to identify an alignment to check further. Hence, storing w*m bits, which is the required width of the RAM 416 when used to buffer data, may suffice in a typical implementation.

Figure 5:
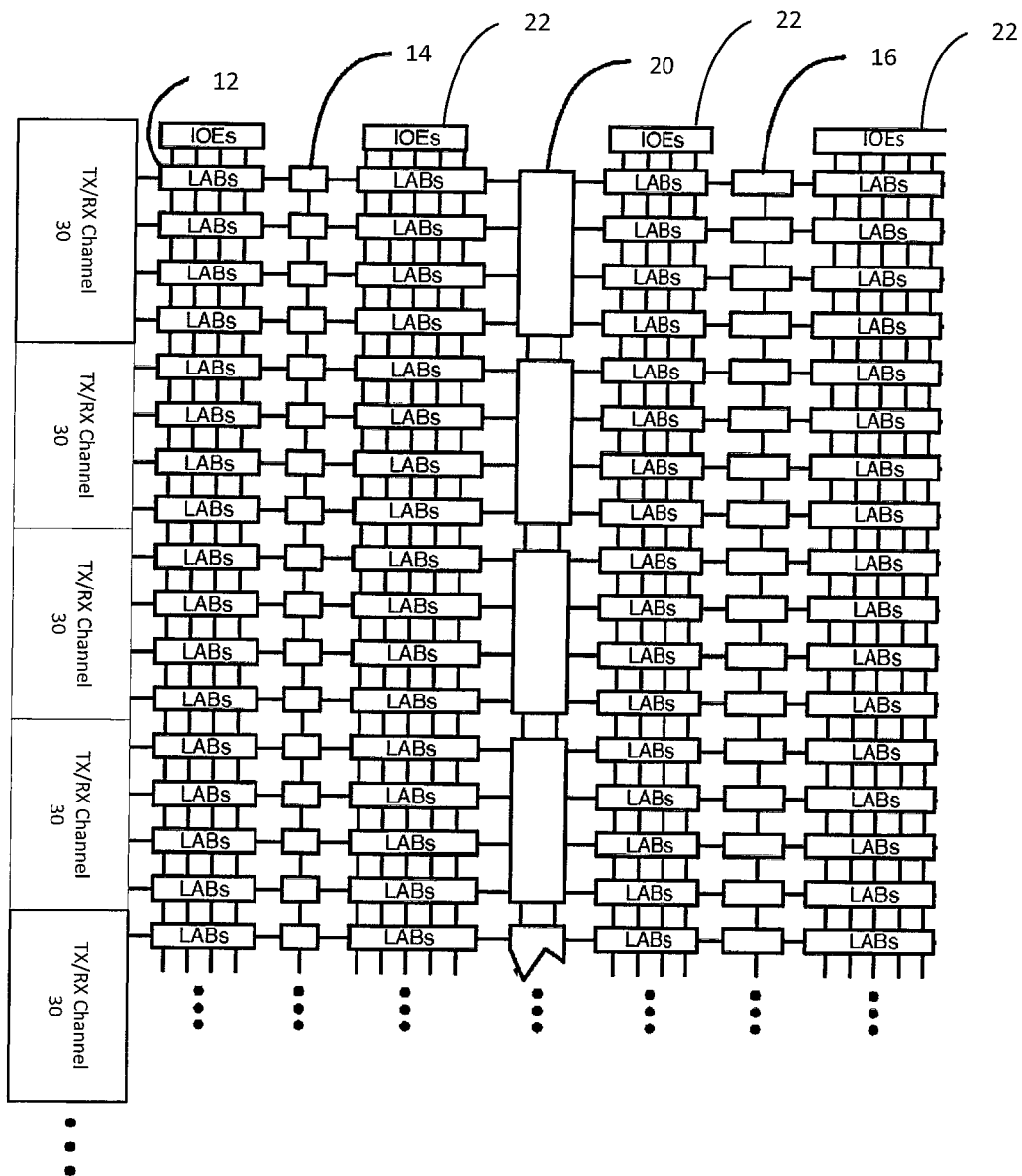
FIG. 5 is a simplified partial block diagram of an exemplary field programmable gate array (FPGA) that may be configured to implement an embodiment of the present invention.

FIG. 5 is a simplified partial block diagram of an exemplary field programmable gate array (FPGA) 10 that may be configured to implement an embodiment of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs).

FPGA 10 includes within its "core" a two-dimensional array of programmable logic array blocks (or LABs) 12 that are interconnected by a network of column and row interconnect conductors of varying length and speed. LABs 12 include multiple (e.g., ten) logic elements (or LEs). A LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 10 may also include a distributed memory structure including random access memory (RAM) blocks of varying sizes provided throughout the array. The RAM blocks include, for example, blocks 14 and blocks 16. These memory blocks can also include shift registers and FIFO buffers. FPGA 10 may further include one or more embedded processor blocks 20, which may be, for example, be digital signal processors or other types of processors.

Input/output elements (IOEs) 22 located, in this example, around the periphery of the chip support numerous single-ended and differential input/output standards. Each IOE 22 is coupled to an external terminal (i.e., a pin) of FPGA 10.

A transceiver (TX/RX) channel array may be arranged as shown, for example, with each TX/RX channel circuit 30 being coupled to several LABs. Each TX/RX channel circuit 30 may include a receiver circuit that includes, among other circuitry, a decoder which implements the technique disclosed herein.

It is to be understood that FPGA 10 is described herein for illustrative purposes only and that the present invention can be implemented in many different types of PLDs, FPGAs, and ASICs.

Figure 6:
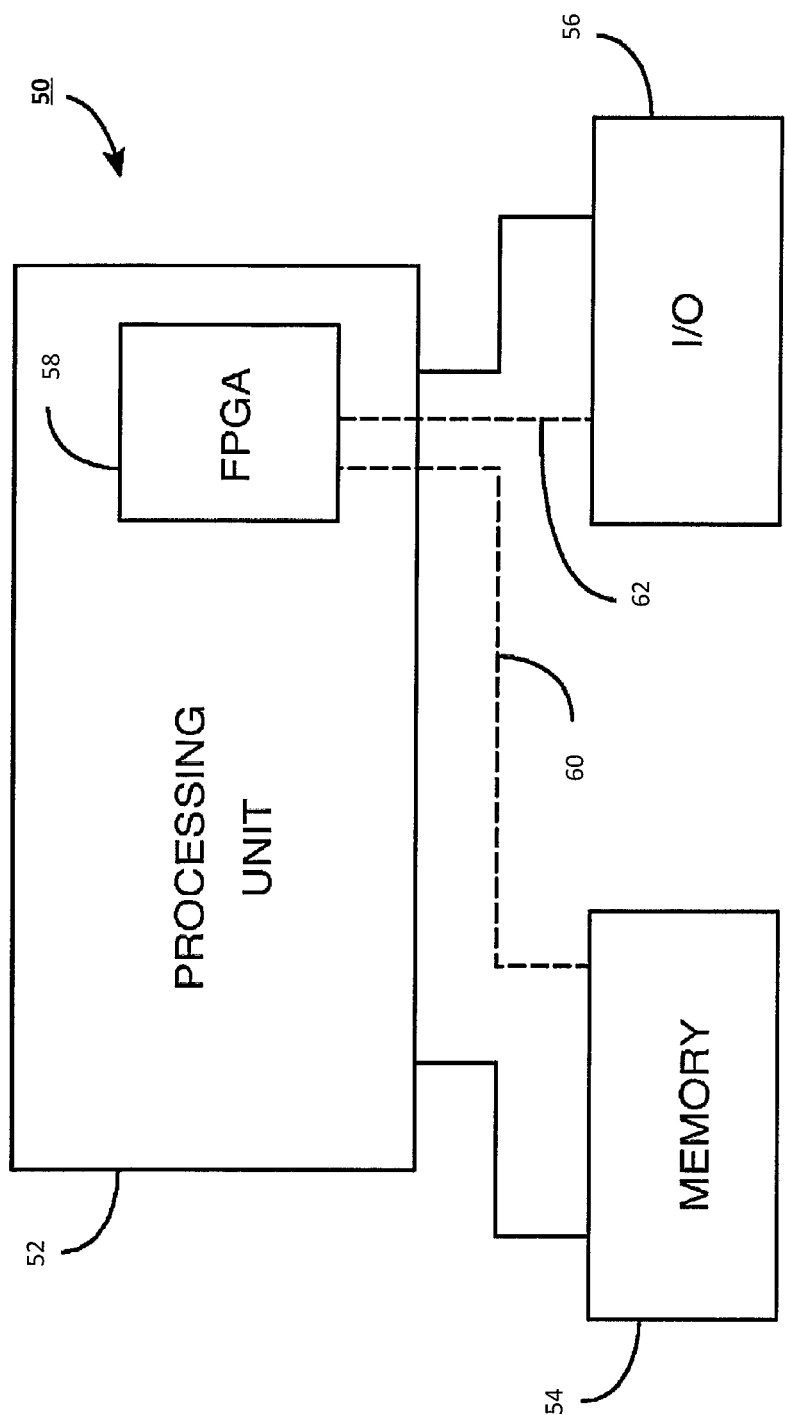
FIG. 6 shows a block diagram of an exemplary digital system that may employ techniques as disclosed herein.

FIG. 6 shows a block diagram of an exemplary digital system 50 that may employ techniques disclosed herein. System 50 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

System 50 includes a processing unit 52, a memory unit 54, and an input/output (I/O) unit 56 interconnected together by one or more buses. According to this exemplary embodiment, FPGA 58 is embedded in processing unit 52. FPGA 58 can serve many different purposes within the system 50. FPGA 58 can, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

Exemplary Embodiments

Exemplary embodiments of the presently disclosed invention include the following.

One embodiment relates to a method for testing a bit-alignment for code lock. The method includes: initially setting a count to zero; for each data word of a number w of FEC symbols received, setting a contribution register value to be a contribution to a syndrome from the w symbols in the data word; after setting the contribution register value, setting a syndrome shift register value to be a syndrome work register value shifted by w symbol positions; after setting the syndrome shift register value, setting the syndrome work register value to be a result of an exclusive-or operation applied to the syndrome shift register value and the contribution register value; and after setting the syndrome work register value, setting an array value at a location in memory associated with the count to the syndrome work register value. The method may be performed by a code lock module of a syndrome evaluator in a decoder.

The method may further include, after setting the array value, setting a syndrome register value to be the syndrome work register value modified as if the data had been padded with zero up to the maximum $2^m-1$ symbols. The method may further include, for each data word received, after setting the syndrome register value, determining whether the count is greater than or equal to n divided by w, where n is the number of symbols in an FEC code. The method may further include: when the count is determined to be greater than or equal to n divided by w, applying the exclusive-or operation to the syndrome register value and the array value to obtain a match result; and, when the match result is all zeroes, indicating that a match is found such that the bit-alignment is to be further checked. The method may further include: determining whether the count is greater than or equal to twice n divided by w; when the count is determined to be greater than or equal to twice n divided by w, indicating that no match is found for the current bit-alignment, applying a bit-slip to obtain a new bit-alignment, and testing the new bit-alignment; and, otherwise, when the count is not determined to be greater than or equal to twice n divided by w, incrementing the count before processing a next received data word.

For the case where each FEC code is scrambled with a fixed pattern prior to transmission, the method may further include, after setting the array value: setting a temporary register value to be the syndrome work register value modified as if data had been padded with zero up to the maximum maximum $2^m-1$ symbols; undoing the effect of the scrambling in the temporary register value using a scrambling syndrome register value to obtain a descrambled value; and setting a syndrome register value to the value that would result had the data not been scrambled. The method may further include, for each data word received, after setting the syndrome register value, determining whether the count is greater than or equal to n divided by w, where n is the number of symbols in an FEC code. The method may further include, when the count is determined to be greater than or equal to n divided by w: applying the exclusive-or operation to the syndrome register value and the array value to obtain a match result; and indicating that a match is found such that the bit-alignment is to be further checked when the match result is all zeroes. The method may further include: determining whether the count is greater than or equal to twice n divided by w; and when the count is determined to be greater than or equal to twice n divided by w, indicating that no match is found for the bit-alignment, applying a bit-slip to obtain a new bit-alignment, and testing the new bit-alignment.

Another embodiment relates to a decoder for decoding an input data stream. The decoder includes: a data input for receiving data words; a code lock module within control logic of a syndrome evaluator that is configured to receive the data words from the data input; registers that hold values that are accessible by the code lock module; and memory that holds array values that are accessible by the code lock module. The code lock module is configured to initially set a count to zero. The code lock module is configured, for each data word of w symbols received, to: set a contribution register value to be a contribution to a syndrome from the w symbols in the data word; set a syndrome shift register value to be a syndrome work register value shifted by w symbol positions; set the syndrome work register value to be a result of an exclusive-or operation applied to the syndrome shift register value and the contribution register value; and set an array value at a location in the memory associated with the count to the syndrome work register value. The code lock module may be further configured to set a syndrome register value to be the syndrome work register value modified as if additional zero'ed data had been received up to the maximum of $2^m-1$ symbols.

The code lock module may be further configured to: determine whether the count is greater than or equal to n divided by w, where n is the number of symbols in an FEC code; when the count is determined to be greater than or equal to n divided by w, apply the exclusive-or operation to the syndrome register value and the array value to obtain a match result; and when the match result is all zeroes, indicate that a match is found such that the bit-alignment is to be further checked. The code lock module may be further configured to: determine whether the count is greater than or equal to twice n divided by w; when the count is determined to be greater than or equal to twice n divided by w, indicate that no match is found for the bit-alignment, apply a bit-slip to obtain a new bit-alignment, and test the new bit-alignment; and otherwise, when the count is not determined to be greater than or equal to twice n divided by w, incrementing the count before processing a next received data word.

For the case where each FEC code is scrambled with a fixed pattern prior to transmission, the code lock module may be further configured to: set a temporary register value to be the syndrome work register value padded up to a full length of the syndrome; descramble the temporary register value using a scrambling syndrome register value to obtain a descrambled value; and set a syndrome register value to be the descrambled value. The code lock module may be further configured to: determine whether the count is greater than or equal to n divided by w, where n is the number of symbols in an FEC code; when the count is determined to be greater than or equal to n divided by w, apply the exclusive-or operation to the syndrome register value and the array value to obtain a match result; and when the match result is all zeroes, indicate that a match is found such that the bit-alignment is to be further checked. The code lock module may be further configured to: determine whether the count is greater than or equal to twice n divided by w; and when the count is determined to be greater than or equal to twice n divided by w, indicate that no match is found for the bit-alignment, apply a bit-slip to obtain a new bit-alignment, and test the new bit-alignment; and otherwise, when the count is not determined to be greater than or equal to twice n divided by w, incrementing the count before processing a next received data word.

Another embodiment relates to an integrated circuit that receives a stream of data words. The integrated circuit includes: a data input for receiving the data words; a code lock module within control logic of a syndrome evaluator that is configured to receive the data words from the data input; registers that hold values that are accessible by the code lock module; and memory means that holds array values that are accessible by the code lock module. The code lock module is configured to initially set a count to zero. The code lock module is configured, for each data word of w symbols received, to: set a contribution register value to be a contribution to a syndrome from the w symbols in the data word; set a syndrome shift register value to be a syndrome work register value shifted by w symbol positions; set the syndrome work register value to be a result of an exclusive-or operation applied to the syndrome shift register value and the contribution register value; and set an array value in the memory means at a location associated with the count to the syndrome work register value.

Another embodiment relates to a system that receives a stream of data words. The system includes: a data input for receiving the data words; a code lock module within control logic of a syndrome evaluator that is configured to receive the data words from the data input; registers that hold values that are accessible by the code lock module; and memory means that holds values that are accessible by the code lock module. The code lock module is configured to initially set a count to zero. The code lock module is configured, for each data word of w symbols received, to: set a contribution register value to be a contribution to a syndrome from the w symbols in the data word; set a syndrome shift register value to be a syndrome work register value shifted by w symbol positions; set the syndrome work register value to be a result of an exclusive-or operation applied to the syndrome shift register value and the contribution register value; and set an array value in the memory means at a location associated with the count to the syndrome work register value.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention considering the above detailed description.

What is claimed is:

1. A decoder for decoding an input data stream, the decoder comprising:
   a data input for receiving data words;
   a code lock module within control logic of a syndrome evaluator that is configured to receive the data words from the data input;
   registers that hold values that are accessible by the code lock module; and memory that holds array values that are accessible by the code lock module, wherein the code lock module is configured to initially set a count to zero, and wherein the code lock module is configured, for each data word of w symbols received, to set a contribution register value to be a contribution to a syndrome from the w symbols in the data word; set a syndrome shift register value to be a syndrome work register value shifted by w symbol positions; set the syndrome work register value to be a result of an exclusive-or operation applied to the syndrome shift register value and the contribution register value; and set an array value at a location in the memory associated with the count to the syndrome work register value.

2. The decoder of claim 1, wherein the code lock module is further configured to set a syndrome register value to be the syndrome work register value modified as if additional zero'ed data had been received up to the maximum of $2^m-1$ symbols, and wherein m is a number of bits per symbol.

3. The decoder of claim 2, wherein the code lock module is further configured to:

determine whether the count is greater than or equal to n divided by w, where n is the number of symbols in a forward error correction code;

when the count is determined to be greater than or equal to n divided by w, apply the exclusive-or operation to the syndrome register value and the array value to obtain a match result; and when the match result is all zeroes, indicate that a match is found for a bit-alignment such that the bit-alignment is to be further checked.

4. The decoder of claim 3, wherein the code lock module is further configured to:

determine whether the count is greater than or equal to twice n divided by w;

when the count is determined to be greater than or equal to twice n divided by w, indicate that no match is found for the bit-alignment, apply a bit-slip to obtain a new bit-alignment, and test the new bit-alignment; and otherwise, when the count is not determined to be greater than or equal to twice n divided by w, incrementing the count before processing a next received data word.

5. The decoder of claim 1, wherein the code lock module is further configured to:

set a temporary register value to be the syndrome work register value padded up to a full length of the syndrome;

descramble the temporary register value using a scrambling syndrome register value to obtain a descrambled value; and set a syndrome register value to be the descrambled value.

6. The decoder of claim 5, wherein the code lock module is further configured to:

determine whether the count is greater than or equal to n divided by w, where n is the number of symbols in a forward error correction code;

when the count is determined to be greater than or equal to n divided by w, apply the exclusive-or operation to the syndrome register value and the array value to obtain a match result; and when the match result is all zeroes, indicate that a match is found for a bit-alignment such that the bit-alignment is to be further checked.

7. The decoder of claim 6, wherein the code lock module is further configured to:

determine whether the count is greater than or equal to twice n divided by w; and when the count is determined to be greater than or equal to twice n divided by w, indicate that no match is found for the bit-alignment, apply a bit-slip to obtain a new bit-alignment, and test the new bit-alignment; and otherwise, when the count is not determined to be greater than or equal to twice n divided by w, incrementing the count before processing a next received data word.

8. A method for testing a bit-alignment for code lock, the method comprising:

initially setting a count to zero;

for each data word of a number w of forward error correction (FEC) symbols received, setting a contribution register value to be a contribution to a syndrome from the w symbols in the data word;

after setting the contribution register value, setting a syndrome shift register value to be a syndrome work register value shifted by w symbol positions;

after setting the syndrome shift register value, setting the syndrome work register value to be a result of an exclusive-or operation applied to the syndrome shift register value and the contribution register value; and after setting the syndrome work register value, setting an array value at a location in memory associated with the count to the syndrome work register value.

9. The method of claim 8 further comprising:

after setting the array value, setting a syndrome register value to be the syndrome work register value modified as if additional zero'ed data had been received up to the maximum of $2^m-1$ symbols, where m is the number of bits per FEC symbol.

10. The method of claim 9 further comprising:

for each data word received, after setting the syndrome register value, determining whether the count is greater than or equal to n divided by w, where n is the number of symbols in a forward error correction code, and n is a multiple of w.

11. The method of claim 10 further comprising:

when the count is determined to be greater than or equal to n divided by w, applying the exclusive-or operation to the syndrome register value and the array value to obtain a match result, and, when the match result is all zeroes, indicating that a match is found such that the bit-alignment is to be further checked.

12. The method of claim 11 further comprising:

determining whether the count is greater than or equal to twice n divided by w;

when the count is determined to be greater than or equal to twice n divided by w, indicating that no match is found for the bit-alignment, applying a bit-slip to obtain a new bit-alignment, and testing the new bit-alignment; and otherwise, when the count is not determined to be greater than or equal to twice n divided by w, incrementing the count before processing a next received data word.

13. The method of claim 8 further comprising:

after setting the array value, setting a temporary register value to be the syndrome work register value modified as if additional zero'ed data had been received up to the maximum of $2^m-1$ symbols, undoing effect of scrambling using a scrambling syndrome register value to obtain a descrambled value, and setting a syndrome register value to be the descrambled value, wherein m is a number of bits per FEC symbol.

14. The method of claim 13 further comprising:
for each data word received, after setting the syndrome register value, determining whether the count is greater than or equal to n divided by w, where n is the number of symbols in a forward error correction code.

15. The method of claim 14 further comprising:
when the count is determined to be greater than or equal to n divided by w, applying the exclusive-or operation to the syndrome register value and the array value to obtain a match result, and, when the match result is all zeroes, indicating that a match is found such that the bit-alignment is to be further checked.

16. The method of claim 15 further comprising:
determining whether the count is greater than or equal to twice n divided by w; and
when the count is determined to be greater than or equal to twice n divided by w, indicating that no match is found for the bit-alignment, applying a bit-slip to obtain a new bit-alignment, and testing the new bit-alignment; and
otherwise, when the count is not determined to be greater than or equal to twice n divided by w, incrementing the count before processing a next received data word.

17. The method of claim 8, wherein the method is performed by a code lock module of a syndrome evaluator in a decoder.

18. An integrated circuit that receives a stream of data words, the integrated circuit comprising:
a data input for receiving the data words;
a code lock module within control logic of a syndrome evaluator that is configured to receive the data words from the data input;
registers that hold values that are accessible by the code lock module; and
memory means that holds array values that are accessible by the code lock module,
wherein the code lock module is configured to initially set a count to zero, and
wherein the code lock module is configured, for each data word of w symbols received, to:
set a contribution register value to be a contribution to a syndrome from the w symbols in the data word;
set a syndrome shift register value to be a syndrome work register value shifted by w symbol positions;
set the syndrome work register value to be a result of an exclusive-or operation applied to the syndrome shift register value and the contribution register value; and
set an array value in the memory means at a location associated with the count to the syndrome work register value.

19. The integrated circuit of claim 18, wherein the code lock module is further configured to set a syndrome register value to be the syndrome work register value padded up to a full length of the syndrome.

20. The integrated circuit of claim 19, wherein the code lock module is further configured to:
determine whether the count is greater than or equal to n divided by w, where n is the number of symbols in a forward error correction code;
when the count is determined to be greater than or equal to n divided by w, apply the exclusive-or operation to the syndrome register value and the array value to obtain a match result; and
when the match result is all zeroes, indicate that a match is found for a bit-alignment such that the bit-alignment is to be further checked.

* * * * *